US012628590B2

(12) United States Patent
Kim

(10) Patent No.: US 12,628,590 B2
(45) Date of Patent: May 12, 2026

(54) SUBSTRATE PROCESSING METHOD

(71) Applicant: WONIK IPS CO., LTD.,
Pyeongtaek-si (KR)

(72) Inventor: Min Su Kim, Pyeongtaek-si (KR)

(73) Assignee: WONIK IPS CO., LTD.,
Pyeongtaek-si (KR)

( * ) Notice: Subject to any disclaimer, the term of this
patent is extended or adjusted under 35
U.S.C. 154(b) by 464 days.

(21) Appl. No.: 18/449,996

(22) Filed: Aug. 15, 2023

(65) Prior Publication Data

US 2024/0162046 A1 May 16, 2024

(30) Foreign Application Priority Data

Nov. 16, 2022 (KR) ........................ 10-2022-0154021

(51) Int. Cl.
*H10P 50/28* (2026.01)
*H01J 37/32* (2006.01)
(52) U.S. Cl.
CPC ........ *H10P 50/283* (2026.01); *H01J 37/3244*
(2013.01); *H01J 2237/3346* (2013.01)
(58) Field of Classification Search
None
See application file for complete search history.

(56) References Cited

U.S. PATENT DOCUMENTS

| | | | |
|---|---|---|---|
| 5,282,925 A | 2/1994 | Jeng et al. | |
| 2020/0098586 A1 | 3/2020 | Xia et al. | |
| 2020/0185238 A1 | 6/2020 | Tabata et al. | |
| 2022/0051938 A1 | 2/2022 | Wu et al. | |
| 2022/0293430 A1* | 9/2022 | Korolik .................. | H10B 41/27 |
| 2023/0343609 A1* | 10/2023 | Kim .................. | H01L 21/02164 |

FOREIGN PATENT DOCUMENTS

| | | |
|---|---|---|
| KR | 1019970003888 B1 | 6/1994 |
| KR | 1020210052560 A | 5/2021 |
| WO | 2020055837 A1 | 3/2020 |

* cited by examiner

*Primary Examiner* — Roberts P Culbert
(74) *Attorney, Agent, or Firm* — WILLIAM PARK AND
ASSOCIATES LTD.

(57) ABSTRACT
A substrate processing method using a substrate processing
apparatus including a process chamber having a reaction
space for processing a substrate including an underlayer and
a multilayer pattern provided on the underlayer and formed
by alternately stacking at least a plurality of first insulating
layers and a plurality of second insulating layers on one
another, a substrate supporter, a gas ejector, and a plasma
reactor, includes a pretreatment step for forming a passiva-
tion layer by supplying, onto the substrate through the gas
ejector, a pretreatment gas, and an etching step for selec-
tively and at least partially etching the plurality of second
insulating layers in a lateral direction relative to the plurality
of first insulating layers by supplying, onto the substrate
through the gas ejector, an etchant.

11 Claims, 11 Drawing Sheets

SUBSTRATE PROCESSING METHOD

CROSS-REFERENCE TO RELATED PATENT APPLICATION

This application claims the priority under 35 U.S.C. § 119(a) to Korean Patent Application No. 10-2022-0154021, filed on Nov. 16, 2022, in the Korean Intellectual Property Office, the disclosure of which is incorporated herein in its entirety by reference.

BACKGROUND OF THE INVENTION

1. Field of the Invention

The present invention relates to semiconductor manufacturing and, more particularly, to a substrate processing apparatus and a substrate processing method.

2. Description of the Related Art

Various processes are performed in a vacuum atmosphere of a substrate processing apparatus to manufacture semiconductor devices. For example, a substrate may be loaded into a process chamber and a process of depositing a thin film on the substrate or etching a thin film deposited on the substrate may be performed. Herein, the substrate may be supported by a substrate supporter mounted in the process chamber, and a process gas may be ejected onto the substrate through a gas ejector mounted above the substrate supporter.

Meanwhile, when one or more layer patterns are provided on the substrate, a plurality of layers may be exposed on the substrate. For example, insulating layers such as oxide layers and nitride layers may be exposed on the substrate. Thereafter, a process of selectively etching one of the insulating layers may be performed. Currently, because the insulating layers are required to have small thicknesses for highly integrated semiconductor devices, undesired insulating layers may be etched due to the lack of selectivity in the step of etching the insulating layers.

In addition, an etchant may not easily penetrate into the thin insulating layers and thus normal wet etching may not be used. Dry etching using a halide-based etching gas is being studied but does not have a high etch selectivity. Furthermore, when a semiconductor layer is present under the insulating layers, there is a problem that the semiconductor layer is also etched when the insulating layers are etched.

SUMMARY OF THE INVENTION

The present invention provides a substrate processing method using dry etching with a high etch selectivity to manufacture highly integrated semiconductor devices. However, the above description is an example, and the scope of the present invention is not limited thereto.

According to an aspect of the present invention, there is provided a substrate processing method using a substrate processing apparatus including a process chamber having a reaction space for processing a substrate including an underlayer and a multilayer pattern provided on the underlayer and formed by alternately stacking at least a plurality of first insulating layers and a plurality of second insulating layers on one another, a substrate supporter coupled to the process chamber to support the substrate, a gas ejector coupled onto the process chamber to face the substrate supporter, and a plasma reactor disposed outside the process chamber and connected to the gas ejector, the substrate processing method including a pretreatment step for forming a passivation layer by supplying, onto the substrate through the gas ejector, a pretreatment gas including a hydrogen-containing gas and an oxygen-containing gas, and an etching step for selectively and at least partially etching the plurality of second insulating layers in a lateral direction relative to the plurality of first insulating layers by supplying, onto the substrate through the gas ejector, an etchant including a halogen-containing gas, a hydrogen-containing gas, an oxygen-containing gas, and a halogen- and hydrogen-containing product produced by reaction of the halogen-containing gas and the hydrogen-containing gas, wherein, in the etching step, at least one of the halogen-containing gas and the hydrogen-containing gas is activated in the plasma reactor and supplied to the gas ejector in a form of radicals.

In the etching step, the halogen-containing gas and an inert gas may be supplied to the plasma reactor, and the hydrogen-containing gas and the oxygen-containing gas may be supplied to the gas ejector.

In the etching step, the halogen-containing gas and an inert gas may be supplied to the plasma reactor, and the hydrogen-containing gas and the oxygen-containing gas may also be supplied to the plasma reactor.

In the etching step, the hydrogen-containing gas and the oxygen-containing gas may be supplied to the plasma reactor, and the halogen-containing gas may be supplied to the gas ejector.

The substrate processing method may further include a removal step for removing the passivation layer, after the etching step.

The passivation layer may be formed on at least exposed portions of the underlayer and, in the etching step, the plurality of second insulating layers may be selectively etched relative to the plurality of first insulating layers and the underlayer.

The plurality of first insulating layers may include silicon oxide ($SiO_2$) layers, the plurality of second insulating layers may include silicon nitride (SiN) layers, and the underlayer may include a polysilicon layer.

In the etching step, the halogen-containing gas may be activated in the plasma reactor and supplied to the gas ejector in a form of radicals, and the hydrogen-containing gas and the oxygen-containing gas may be supplied to the gas ejector in an inactive state.

The hydrogen-containing gas and the oxygen-containing gas may be supplied to the gas ejector through a connection pipe connecting the plasma reactor and the gas ejector.

The halogen-containing gas may include $NF_3$ gas, the hydrogen-containing gas may include $NH_3$ gas, and the product may include ammonium fluoride ($NH_3(HF)_x$).

The oxygen-containing gas may include $O_2$ gas, $O_3$ gas), or $N_2O$ gas.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
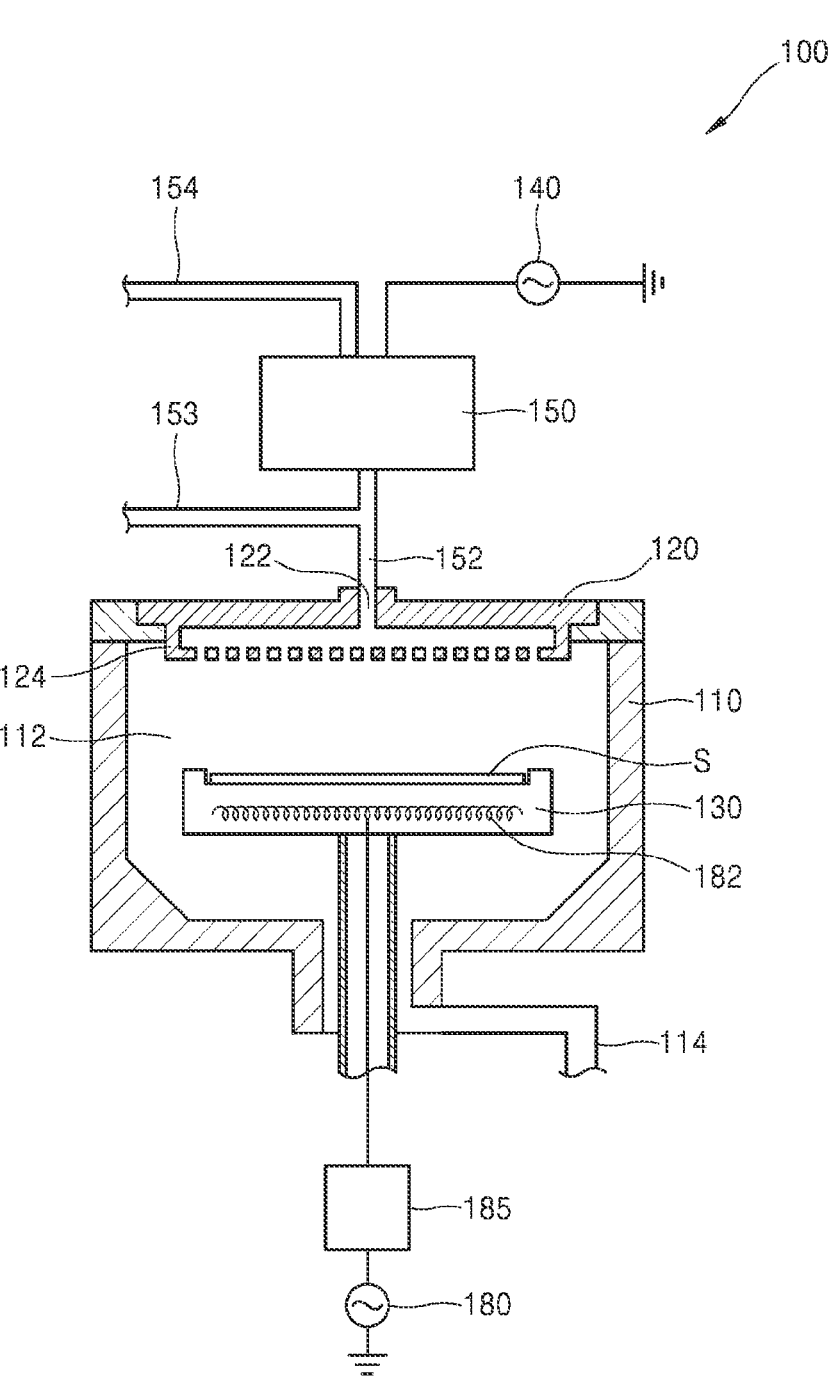
FIG. 1 is a cross-sectional view of a substrate processing apparatus according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

FIG. 1 is a cross-sectional view of a substrate processing apparatus 100 according to an embodiment of the present invention.

Referring to FIG. 1, the substrate processing apparatus 100 may include a process chamber 110, a gas ejector 120, a substrate supporter 130, and a plasma reactor 150.

Specifically, the process chamber 110 may have a reaction space 112 where a substrate S may be processed. The process chamber 110 may be connected to a vacuum pump (not shown) through an exhaust pipe 114 to form a vacuum atmosphere. Furthermore, the process chamber 110 may include an entrance through which the substrate S is loaded into or unloaded from the reaction space 112, and a gate structure (not shown) for opening or closing the entrance. The process chamber 110 may be provided in various shapes and include, for example, a side wall for defining the reaction space 112, and a cover located on top of the side wall, e.g., a top lid.

The gas ejector 120 may be coupled to the process chamber 110 to supply, to the reaction space 112, a process gas supplied from the outside of the process chamber 110. Specifically, the gas ejector 120 may be coupled to the process chamber 110 to face the substrate supporter 130. For example, the gas ejector 120 may be mounted on the process chamber 110 to eject the process gas onto the substrate S seated on the substrate supporter 130.

In some embodiments, the gas ejector 120 may include an inlet 122 connected to a gas pipe 152 to receive the process gas, and a distribution plate 124 for ejecting, into the reaction space 112, the process gas received through the inlet 122 and dispersed inside. Furthermore, the gas ejector 120 may further include a blocker plate for dispersing the process gas having passed through the inlet 122.

In some embodiments, the gas ejector 120 may have various forms, e.g., a shower head or a nozzle. When the gas ejector 120 is provided in the form of a shower head, the gas ejector 120 may be coupled to the process chamber 110 to partially cover the top of the process chamber 110. For example, the gas ejector 120 may be coupled to the cover or the top lid of the process chamber 110.

The substrate supporter 130 may be coupled to the process chamber 110 to support the substrate S in the reaction space 112. For example, the substrate supporter 130 may be mounted in the process chamber 110 to face the gas ejector 120. Furthermore, the substrate supporter 130 may include a heater 182 for heating the substrate S. For example, the heater 182 may be provided in the substrate supporter 130. A heater power source 180 may be connected to the heater 182 to apply power to the heater 182, and an alternating current (AC) filter 185 may be additionally provided between the heater 182 and the heater power source 180.

An upper surface of the substrate supporter 130 may generally have a shape corresponding to the shape of the substrate S, but is not limited thereto, and be provided in various shapes larger than the substrate S to stably seat the substrate S thereon. In an example, a shaft of the substrate supporter 130 may be liftably connected to an external motor (not shown) and, in this case, connected to a bellow tube (not shown) for airtightness. Furthermore, the substrate supporter 130 may also be called a substrate holder, a susceptor, or the like because it is configured to seat the substrate S thereon.

In some embodiments, the substrate supporter 130 may further include an electrostatic electrode to fix the substrate S thereon by applying electrostatic force to the substrate S. In this case, the electrostatic electrode may receive direct current (DC) power from an electrostatic power supplier (not shown).

The plasma reactor 150 may be disposed outside the process chamber 110 so as to be connected to the gas ejector 120. The plasma reactor 150 may be connected to the gas ejector 120 through a connection pipe 152. Furthermore, the process gas may be introduced into the plasma reactor 150 through a gas pipe 154. The plasma reactor 150 may also be called a remote plasma reactor or a remote plasma generator in that it is disposed outside the process chamber 110.

Furthermore, a plasma power source 140 for applying power may be connected to the plasma reactor 150. For example, the plasma power source 140 may include at least one radio frequency (RF) power source to apply at least one type of RF power to the process chamber 110. The plasma reactor 150 may form a plasma atmosphere by using an inductively coupled plasma (ICP) method, a capacitively coupled plasma (CCP) method, a toroidal plasma method, a microwave (MW) method, or the like.

The plasma reactor 150 may receive at least one process gas through the gas pipe 154, receive plasma power to form a plasma atmosphere therein, and activate the process gas to generate radicals. These radicals may be provided to the gas ejector 120 through the connection pipe 152 and ejected onto the substrate S through the gas ejector 120. Optionally, the connection pipe 152 may be heated to prevent formation or adsorption of by-products. For example, the connection pipe 152 may be wound with a heater jacket or a heating tape.

In some embodiments, the gas ejector 120 may receive an additional process gas through an additional gas pipe 153 connected to the connection pipe 152 without passing through the plasma reactor 150. The process gas supplied through the gas pipe 153 and the process gas or radicals supplied through the plasma reactor 150 may be mixed or react with each other in the connection pipe 152.

In some embodiments, the gas ejector 120 may include a heating means, e.g., a heater (not shown). As such, the gas ejector 120 may be controlled in temperature by the heater. The heater may include various types of heating means, e.g., a cartridge heater, a hot wire heater, a heat exchanger, an infrared heater, or a laser heater.

In some embodiments, the substrate processing apparatus 100 may be used as a pretreatment apparatus, an etching apparatus for etching a thin film on the substrate S, or the like. Substrate processing methods according to embodiments of the present invention will now be described with reference to the substrate processing apparatus 100.

Figure 2:
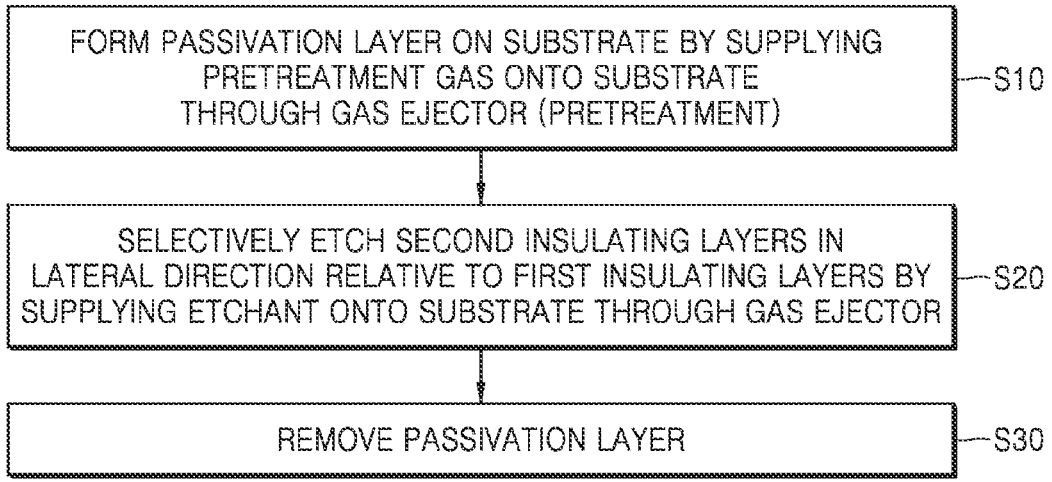
FIG. 2 is a flowchart of a substrate processing method according to an embodiment of the present invention.
Figure 3:
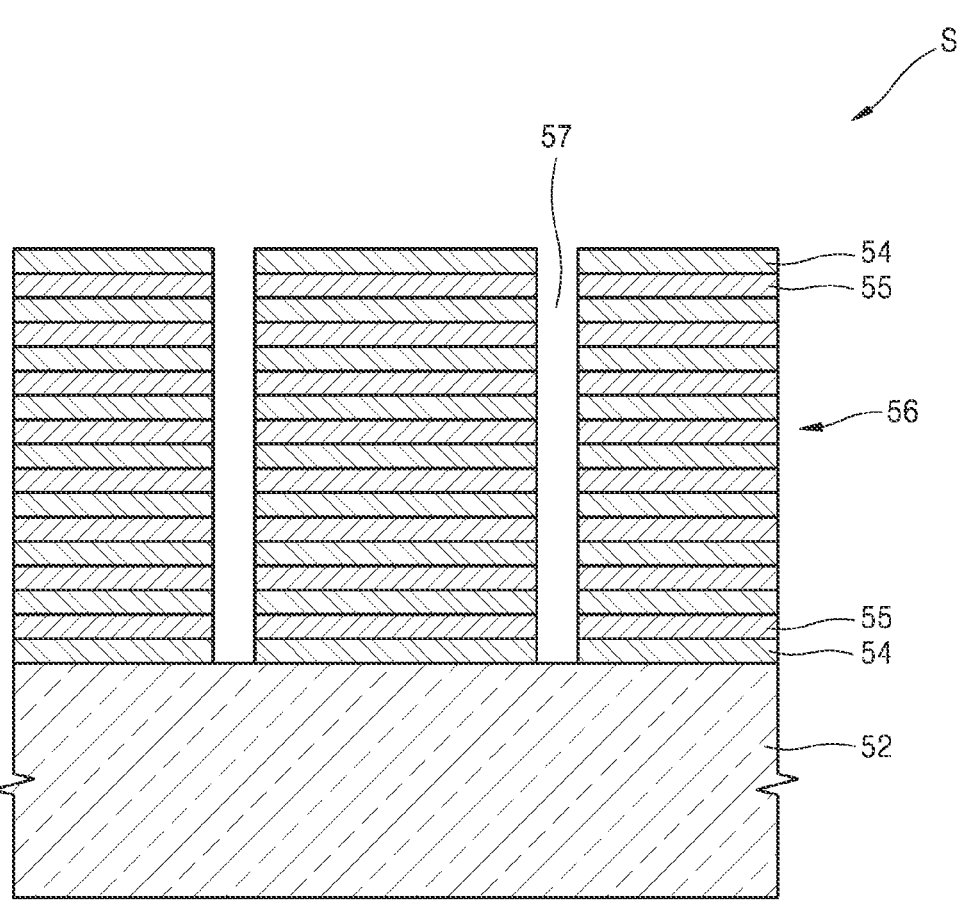
FIGS. 3 and 4 are cross-sectional views of a substrate for describing a substrate processing method according to an embodiment of the present invention.
Figure 4:
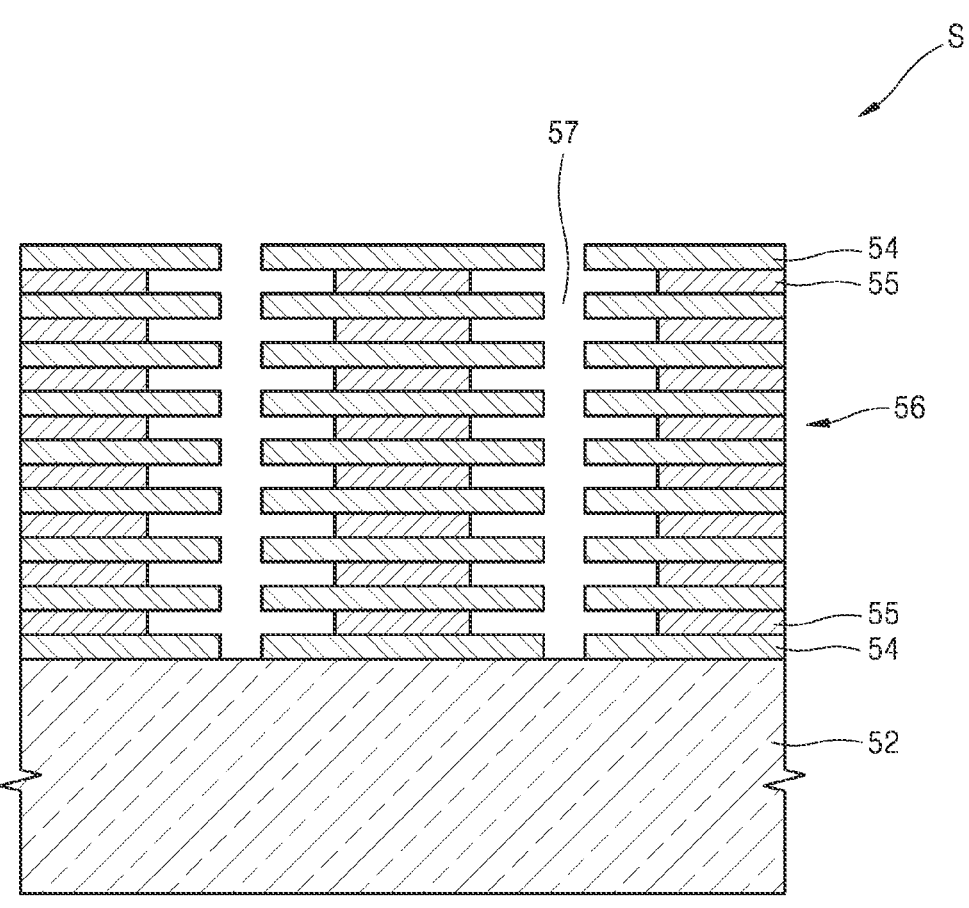

FIG. 2 is a flowchart of a substrate processing method according to an embodiment of the present invention, and FIGS. 3 and 4 are cross-sectional views of the substrate S for describing a substrate processing method according to an embodiment of the present invention.

Referring to FIG. 3, a multilayer pattern 56 may be formed on the substrate S. For example, the substrate S may include a semiconductor wafer 52, and a structure for forming a semiconductor device may be formed on the semiconductor wafer 52. Specifically, the multilayer pattern 56 may be formed on the semiconductor wafer 52. The semiconductor wafer 52 may include a monocrystalline structure of a semiconductor material, e.g., silicon, germanium, or silicon-germanium, and further include a semiconductor epitaxial layer.

The multilayer pattern 56 may include a pattern structure in which a plurality of first insulating layers 54 and a plurality of second insulating layers 55 are alternately stacked on one another. After the first and second insulating layers 54 and 55 are alternately stacked on one another, the first and second insulating layers 54 and 55 may be patterned using photolithography and etching to form a plurality of trenches 57. For example, the first insulating layers 54 may include silicon oxide ($SiO_2$) layers and the second insulating layers 55 may include silicon nitride (SiN) layers.

In some embodiments, the substrate S may be processed using the substrate processing apparatus 100. For example, the substrate S may be processed while being seated on the substrate supporter 130 inside the process chamber 110. Specifically, a step of loading the substrate S into the process chamber 110 and then seating the substrate S on the substrate supporter 130 may be performed.

Referring to FIGS. 1 to 4, the substrate processing method according to an embodiment may include an etching step S20 for selectively and at least partially etching the second insulating layers 55 in a lateral direction relative to the first insulating layers 54 by supplying an etchant onto the substrate S through the gas ejector 120.

For example, in the etching step S20, the etchant may include a halogen-containing gas, a hydrogen-containing gas, an oxygen-containing gas, and a halogen- and hydrogen-containing product produced by the reaction of the halogen-containing gas and the hydrogen-containing gas. The product in the etchant may be produced by the reaction of the halogen-containing gas and the hydrogen-containing gas in the connection pipe 152, in the gas ejector 120, or in the reaction space 112 of the process chamber 110.

In some embodiments, plasma ignition may be performed in the plasma reactor 150 by supplying an inert gas into the plasma reactor 150.

In some embodiments, in the etching step S20, at least one of the halogen-containing gas and the hydrogen-containing gas may be activated in the plasma reactor 150 and supplied to the gas ejector 120 in the form of radicals.

For example, in the etching step S20, the halogen-containing gas and the inert gas may be supplied to the plasma reactor 150, and the hydrogen-containing gas and the oxygen-containing gas may be supplied to the gas ejector 120. As such, the halogen-containing gas may be activated in the plasma reactor 150 and supplied to the gas ejector 120 in the form of radicals, and the hydrogen-containing gas and the oxygen-containing gas may be supplied to the gas ejector 120 through the gas pipe 153 in an inactive state without passing through the plasma reactor 150.

Specifically, the halogen-containing gas may be activated in the plasma reactor 150 and supplied to the gas ejector 120 through the connection pipe 152 in the form of radicals, and the hydrogen-containing gas and the oxygen-containing gas may be supplied to the connection pipe 152 through the gas pipe 153. Furthermore, the radicals of the halogen-containing gas may react with the hydrogen-containing gas in the connection pipe 152 or the gas ejector 120 to produce the halogen- and hydrogen-containing product.

As another example, the hydrogen-containing gas may be activated in the plasma reactor 150 and supplied to the gas ejector 120 in the form of radicals, and the halogen-containing gas and the oxygen-containing gas may be supplied to the gas ejector 120 through the gas pipe 153 in an inactive state without passing through the plasma reactor 150. Specifically, the hydrogen-containing gas may be activated in the plasma reactor 150 and supplied to the gas ejector 120 through the connection pipe 152 in the form of radicals, and the halogen-containing gas and the oxygen-containing gas may be supplied to the connection pipe 152 through the gas pipe 153. Furthermore, the radicals of the hydrogen-containing gas may react with the halogen-containing gas in the connection pipe 152 or the gas ejector 120 to produce the halogen- and hydrogen-containing product.

As still another example, in the etching step S20, two or more, or all of the hydrogen-containing gas, the halogen-containing gas, and the oxygen-containing gas may be supplied to the gas ejector 120 through the plasma reactor 150. In this case, at least one or all of these gases may be activated and discharged from the plasma reactor 150 in the form of radicals. For example, the halogen-containing gas and the inert gas may be supplied to the plasma reactor 150, and the hydrogen-containing gas and the oxygen-containing gas may also be supplied to the plasma reactor 150.

In this case, the radicals of the hydrogen-containing gas may react with the radicals of the halogen-containing gas in the connection pipe 152 or the gas ejector 120 to produce the halogen- and hydrogen-containing product. However, when both of the hydrogen-containing gas and the halogen-containing gas are activated in the plasma reactor 150, the radicals thereof may react in the plasma reactor 150 to produce the product and thus by-products may be adsorbed onto the plasma reactor 150.

Therefore, contamination of the plasma reactor 150 may be prevented by activating only one of the hydrogen-containing gas and the halogen-containing gas in the plasma reactor 150 and supplying the other gases to the connection pipe 152 or the gas ejector 120 in an inactive state.

As still another example, in the etching step S20, the hydrogen-containing gas and the oxygen-containing gas may be supplied to the plasma reactor 150, and the halogen-containing gas may be supplied to the gas ejector 120. In this case, the hydrogen-containing gas and the oxygen-containing gas may be activated in the plasma reactor 150 and supplied to the gas ejector 120 in the form of radicals.

In some embodiments, the halogen-containing gas may include a fluorine-based or chlorine-based gas, and the hydrogen-containing gas may include a gas containing both of hydrogen and nitrogen. In a specific example, the halogen-containing gas may include $NF_3$ gas, the hydrogen-containing gas may include $NH_3$ gas, and the inert gas may include argon (Ar) gas.

Figure 9:
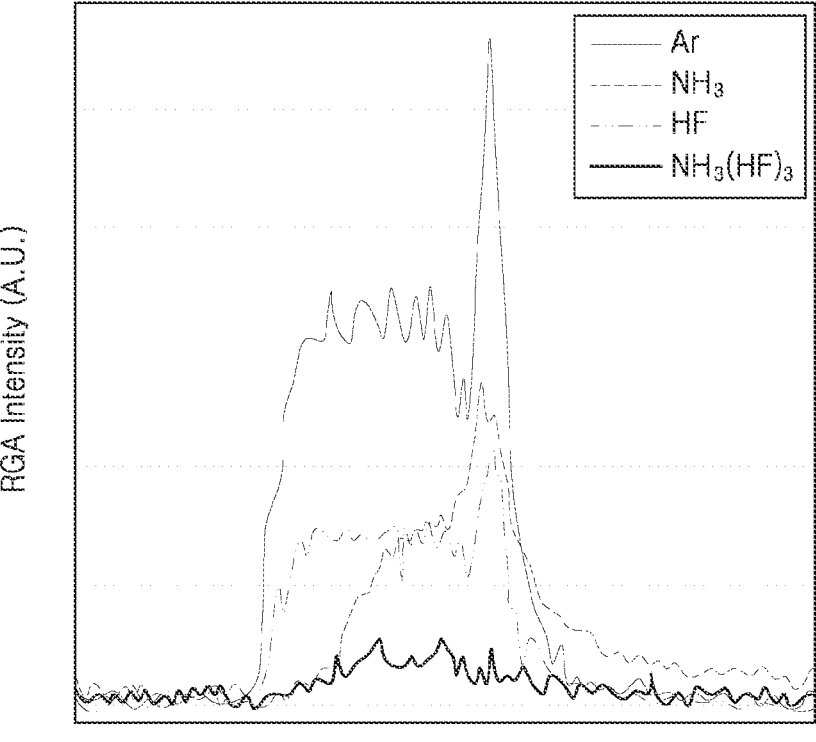
FIG. 9 is a graph showing a residual gas analysis (RGA) result of components of an etchant in an etching step of a substrate processing method according to some embodiments of the present invention.

The $NF_3$ gas and the $NH_3$ gas may react with each other while at least one of the two gases is activated, to produce ammonium fluoride ($NH_3(HF)_x$) as a product. The ammonium fluoride may be used as an etchant for selectively etching the second insulating layers 55. When the $NF_3$ gas, the $NH_3$ gas, and the Ar gas are supplied to the gas ejector 120 and at least one of the $NF_3$ gas and the $NH_3$ gas is activated, a residual gas analysis (RGA) result of FIG. 9 shows that $NH_3(HF)_3$ is produced in the reaction space 112 of the process chamber 110 in addition to Ar, $NH_3$, HF gases.

Furthermore, the oxygen-containing gas may include $O_2$ gas, $O_3$ gas), or $N_2O$ gas. When the second insulating layers 55, e.g., the SiN layers, are etched from the multilayer pattern 56 in which the $SiO_2$ and SiN layers are stacked on one another, the oxygen-containing gas may facilitate uniform etching of the SiN layers at a top portion and a bottom portion.

For example, by adding the oxygen-containing gas with a relatively high electronegativity, e.g., the $O_2$ gas, to the ammonium fluoride so as to add oxygen bonds to relatively weak hydrogen bonds, ionization efficiency of fluorine may be reduced to reduce surface modification efficiency by fluorine and the ammonium fluoride may be facilitated to reach the bottom of the multilayer pattern 56 without being thermally decomposed. As such, when the SiN layers are etched from the multilayer pattern 56, vertical direction uniformity may be increased.

Figure 10:
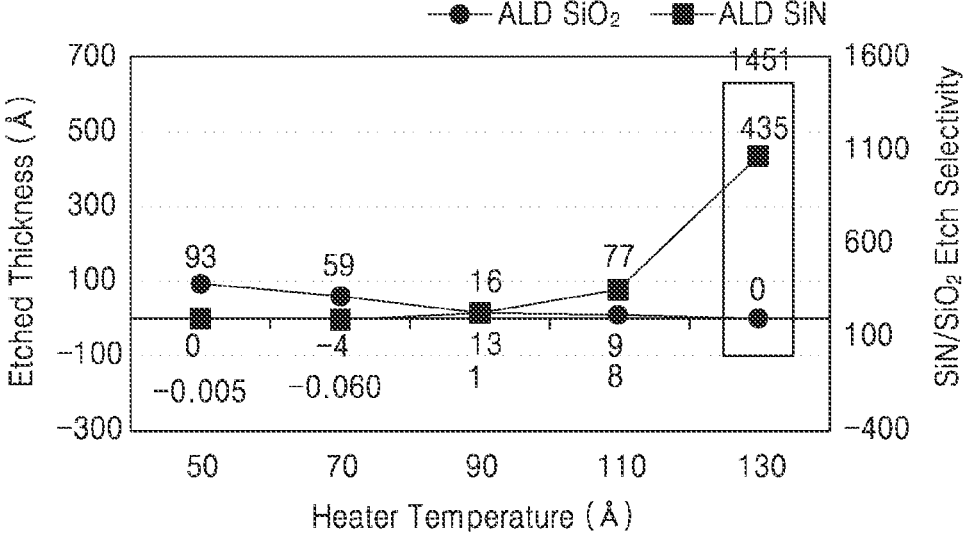
FIG. 10 is a graph showing an etch selectivity between insulating layers based on a temperature of a substrate processor in a substrate processing method according to some embodiments of the present invention.

When the multilayer pattern 56 is etched, an etch selectivity may depend on a temperature of the substrate S, i.e., a temperature of the substrate supporter 130. Referring to FIG. 10, it is shown that etched thicknesses of and etch selectivity between the SiN layers and the $SiO_2$ layers differ depending on the temperature of the heater 182 in the substrate supporter 130. To selectively etch the SiN layers relative to the $SiO_2$ layers, the temperature of the heater 182 or the substrate supporter 130 may be 100° C. or higher and maintained at 110° C. or higher to achieve a high etch selectivity.

However, the above result is a result of etching SiN and $SiO_2$ layers deposited by atomic layer deposition (ALD), and a temperature range for etch selectivity between SiN and $SiO_2$ layers deposited under another condition by another method such as plasma enhanced chemical vapor deposition (PECVD) may differ.

FIGS. 5 to 8 are cross-sectional views of the substrate S for describing a substrate processing method according to another embodiment of the present invention. The substrate processing method according to the current embodiment may be similar to the substrate processing method of FIGS. 3 to 4, and a repeated description between the two embodiments is not provided herein.

Referring to FIGS. 1, 2, and 5 to 8, the substrate processing method may include a pretreatment step S10 for forming a passivation layer 58 on the substrate S by supplying a pretreatment gas onto the substrate S through the gas ejector 120, and an etching step S20 for selectively and at least partially etching the second insulating layers 55 in a lateral direction relative to the first insulating layers 54 by supplying an etchant onto the substrate S through the gas ejector 120. Optionally, the substrate processing method may further include a removal step S30 for removing the passivation layer 58 after the etching step S20.

Figure 5:
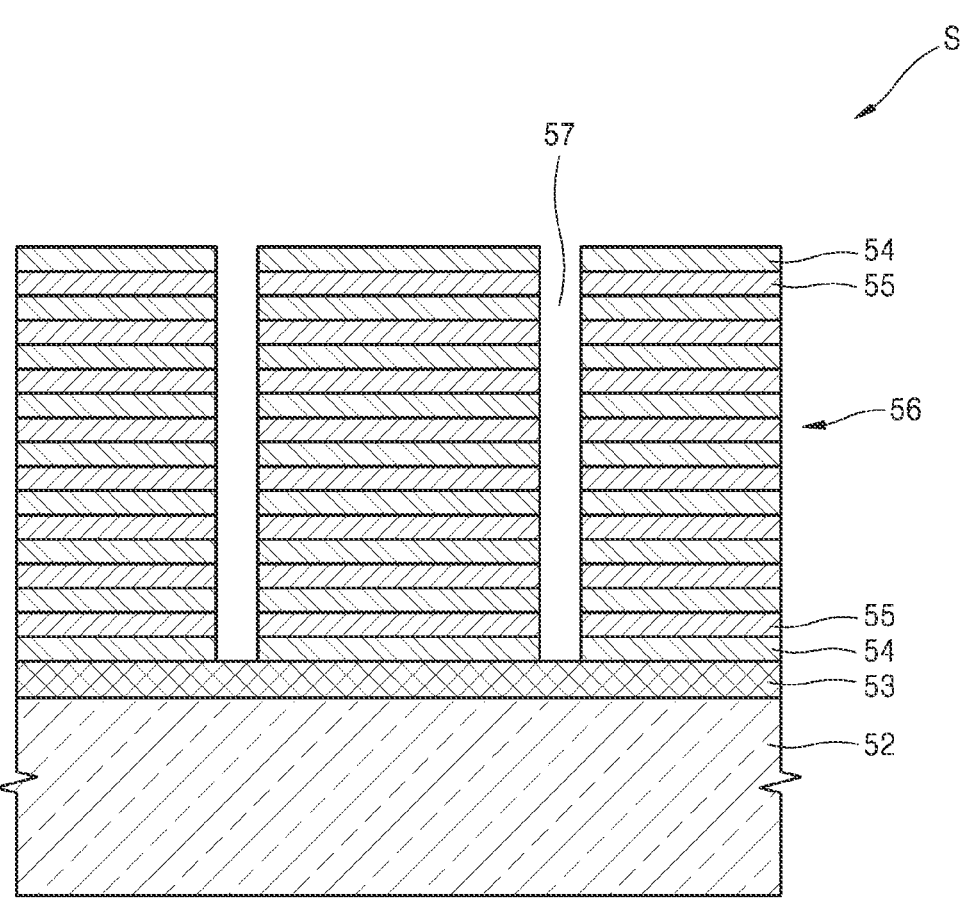
FIGS. 5 to 8 are cross-sectional views of a substrate for describing a substrate processing method according to another embodiment of the present invention.

Referring to FIGS. 1, 2, and 5, the multilayer pattern 56 may be formed on the underlayer 53. For example, the underlayer 53 may be formed on the semiconductor wafer 52, and the multilayer pattern 56 may be formed on the underlayer 53. In some embodiments, the underlayer 53 may include a polysilicon layer.

Figure 6:
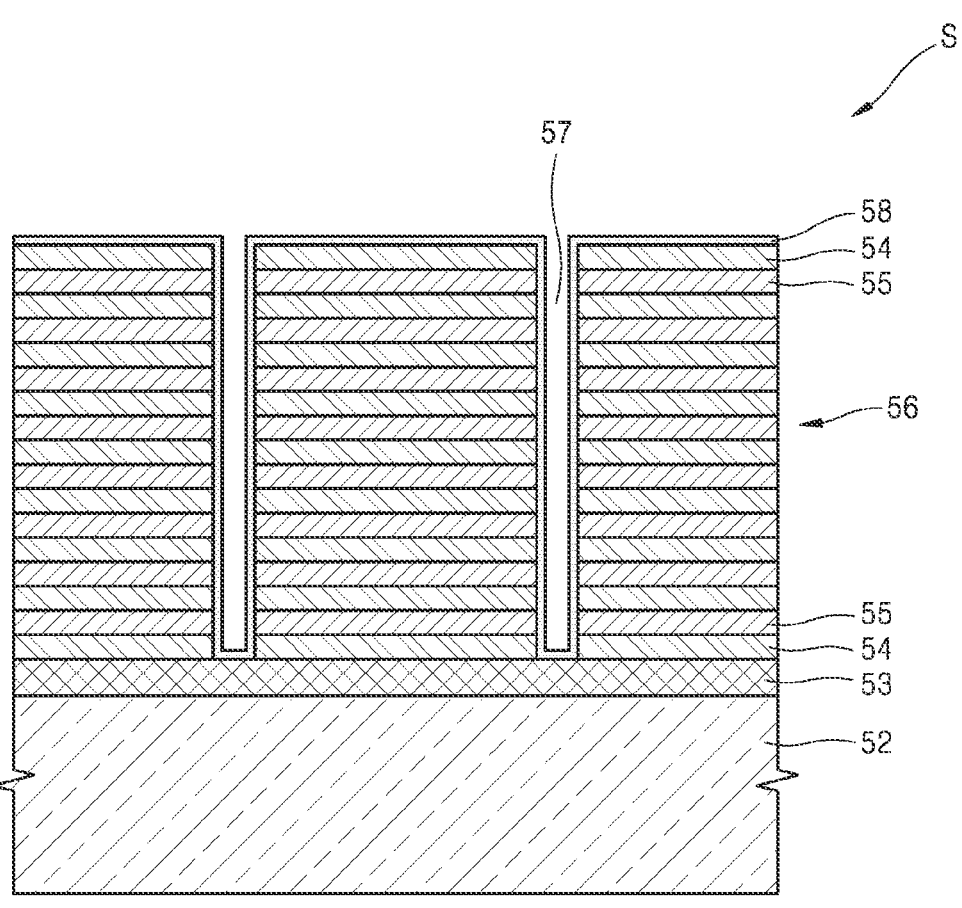

Referring to FIGS. 1, 2, and 6, in the pretreatment step S10, the passivation layer 58 may be formed on the substrate S. For example, the passivation layer 58 may be formed on at least portions of the underlayer 53 exposed by the multilayer pattern 56. Furthermore, the passivation layer 58 may be formed on side walls of the first and second insulating layers 54 and 55, an upper surface of the underlayer 53, and an upper surface of the multilayer pattern 56, which are exposed by the trenches 57.

Specifically, in the pretreatment step S10, a pretreatment gas including a hydrogen-containing gas and an oxygen-containing gas may be supplied onto the substrate S. In the pretreatment step S10, the oxygen-containing gas of the pretreatment gas may mainly oxidize exposed portions of the substrate S. The passivation layer 58 may be formed as different layers with different thicknesses on the underlayer 53 and the multilayer pattern 56.

For example, the passivation layer 58 may be formed as a $SiO_2$ layer on the underlayer 53 and may not be defined as a separate layer on the first and second insulating layers 54 and 55. That is, unlike the illustration of FIG. 6, the passivation layer 58 on the multilayer pattern 56 in which $SiO_2$ and SiN layers are stacked on one another may not be defined as a separate layer but provided as a surface treatment layer.

In some embodiments, the pretreatment step S10 may also be called an $O_2$-treatment step, and the hydrogen-containing gas may be omitted from the pretreatment gas.

In some embodiments, in the pretreatment step S10, the hydrogen-containing gas and the oxygen-containing gas may be supplied to the gas ejector 120 in an inactive state. For example, in the pretreatment step S10, the hydrogen-containing gas and the oxygen-containing gas may be supplied to the connection pipe 152 through the gas pipe 153.

In some embodiments, in the pretreatment step S10, a halogen-containing gas may be supplied to the gas ejector 120 through the plasma reactor 150 in an inactive state or may not be supplied. Because the halogen-containing gas is not substantially required in the pretreatment step S10, the halogen-containing gas may not be supplied or supplied in an inactive state so as not to participate in reaction. As another example, the halogen-containing gas may be supplied to the connection pipe 152 through the gas pipe 153 in an inactive state.

Figure 7:
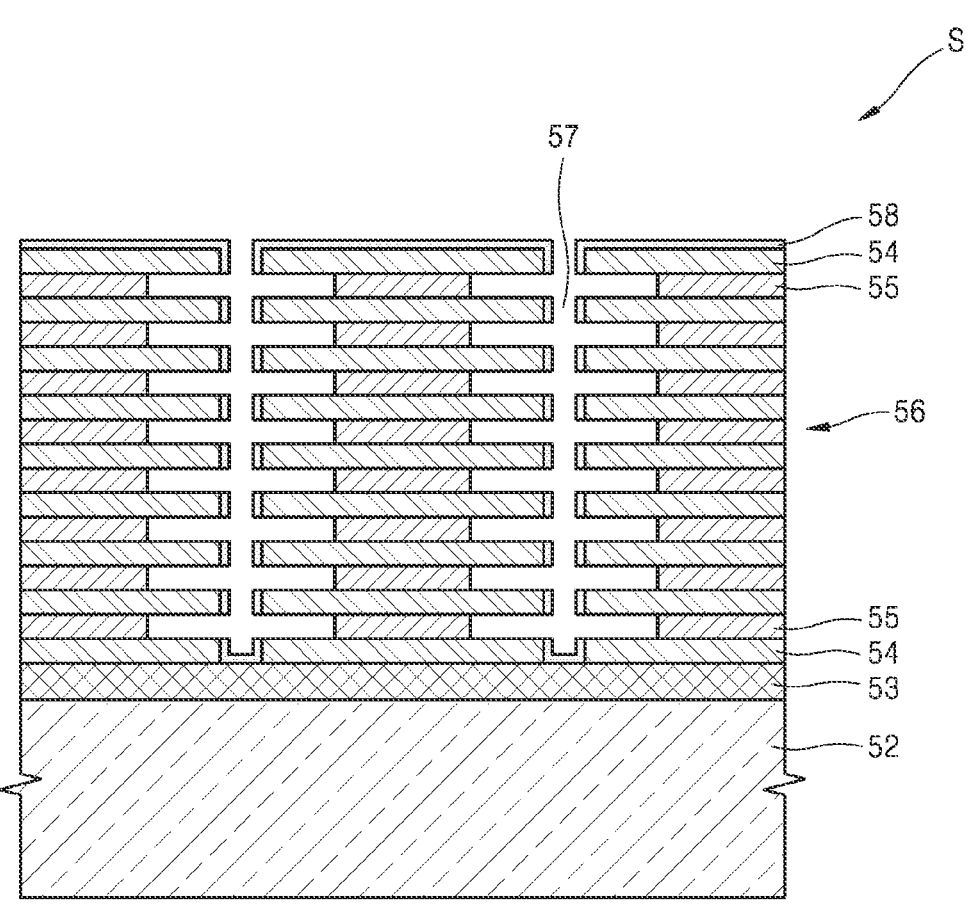

Referring to FIGS. 1, 2, and 7, in the etching step S20, the second insulating layers 55 may be selectively and at least partially etched in a lateral direction relative to the first insulating layers 54 by supplying the etchant including a halogen-containing gas, a hydrogen-containing gas, an oxygen-containing gas, and a halogen- and hydrogen-containing product onto the substrate S through the gas ejector 120.

The etching step S20 of the current embodiment may be the same as the etching step S20 described above in relation to FIGS. 3 and 4.

The passivation layer 58 may reduce or prevent etching of the underlayer 53 in the etching step S20. Furthermore, by providing the oxygen-containing gas in addition to ammonium fluoride as the etchant in the etching step S20, the passivation layer 58 may be repeatedly and additionally formed on the underlayer 53. As such, even when the passivation layer 58 on the underlayer 53 is partially etched in the etching step S20, the passivation layer 58 may be repeatedly replenished to prevent the underlayer 53 from being etched.

Furthermore, because the passivation layer 58 on the second insulating layers 55 is not substantially a separate layer and is merely a surface treatment layer, the passivation layer 58 on the second insulating layers 55 may be etched without being distinguished from the second insulating layers 55 in the etching step S20.

As described above, in the etching step S20, because the halogen- and hydrogen-containing product produced by supplying the halogen-containing gas, the hydrogen-containing gas, and the oxygen-containing gas together is used as the etchant, the second insulating layers 55 in the multilayer pattern 56 may be selectively etched relative to the underlayer 53 and the first insulating layers 54. In the etching step S20, the oxygen-containing gas may not only serve to prevent etching of the underlayer 53 by oxidizing the underlayer 53 but also contribute to increase etch uniformity at a bottom portion and a top portion of the second insulating layers 55 in the multilayer pattern 56.

In some embodiments, the above-described pretreatment step S10 may be omitted and the etching step S20 may be directly performed. In this case, oxidization of the underlayer 53 by the oxygen-containing gas in the etching step S20 may partially prevent etching of the underlayer 53. However, because etching and oxidization may occur simultaneously, partial etching of the underlayer 53 may not be completely avoided.

In some embodiments, the etching step S20 may be temporally divided into two or more steps. For example, the etching step S20 may be partially performed at the end of the pretreatment step S10 and then a main part of the etching step S20 may be followed.

Figure 8:
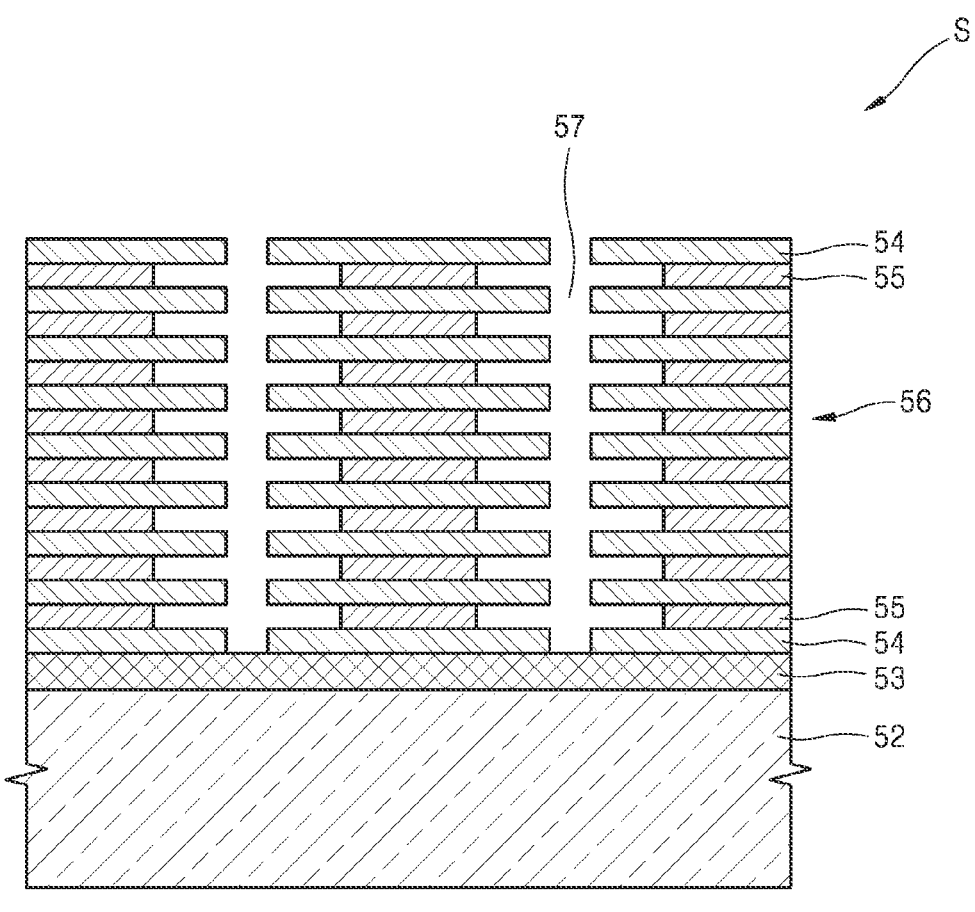

Referring to FIGS. 1, 2, and 8, after the etching step S20, the removal step S30 for removing the passivation layer 58 may be performed. For example, the passivation layer 58, e.g., a SiO$_2$ layer, may be removed by performing annealing while an oxide etching gas is being supplied onto the substrate S. For example, the oxide etching gas may include halide radicals or NH$_4$F, and further include H$_2$ gas and O$_3$ gas). In this atmosphere, surface oxide may be removed and surface cleaning may be performed.

Figure 11:
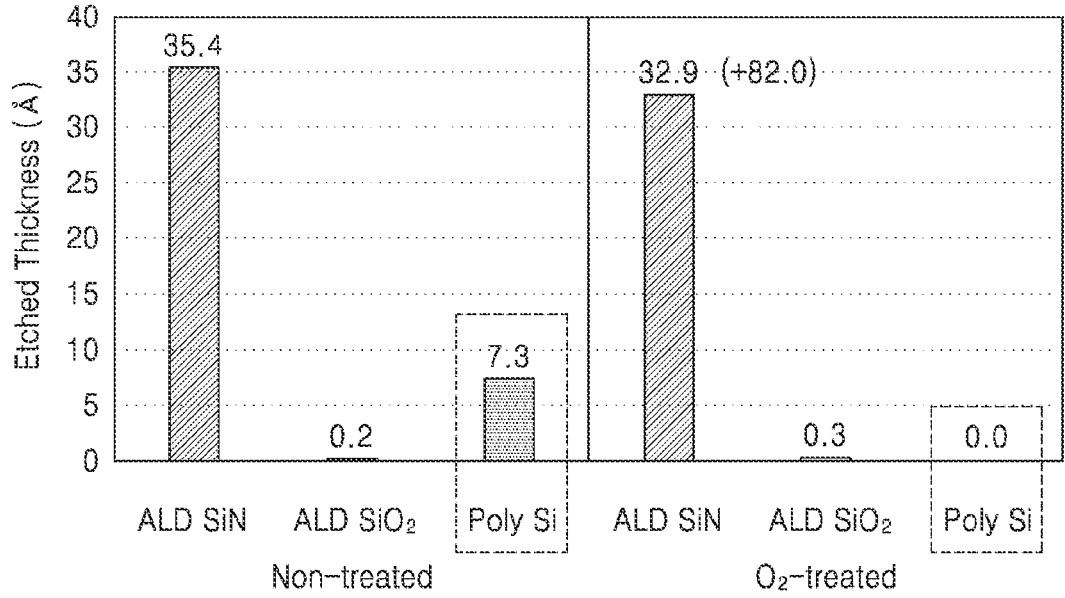
FIG. 11 is a graph showing etched thicknesses of layers based on whether pretreatment is performed in a substrate processing method according to some embodiments of the present invention.

FIG. 11 is a graph showing etched thicknesses of layers based on whether pretreatment is performed in a substrate processing method according to some embodiments of the present invention.

Referring to FIG. 11, it is shown that the SiN layers are etched and the polysilicon layer provided as the underlayer 53 is partially etched when pretreatment is omitted, and that the underlayer 53 and the SiO$_2$ layers are hardly etched and the SiN layers are etched with a high selectivity when O$_2$-treatment is performed as pretreatment.

Therefore, based on the substrate processing apparatus 100 and the substrate processing method according to embodiments of the present invention, the second insulating layers 55 may be uniformly etched with a high selectivity relative to the first insulating layers 54 in the multilayer pattern 56, and etching of the underlayer 53 may be reduced or prevented.

Using the above-described substrate processing methods according to some embodiments of the present invention, a high etch selectivity may be achieved in an insulating layer etching process preformed to manufacture highly integrated semiconductor devices. However, the scope of the present invention is not limited to the above effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate processing method using a substrate processing apparatus comprising a process chamber having a reaction space for processing a substrate comprising an underlayer and a multilayer pattern provided on the underlayer and formed by alternately stacking at least a plurality of first insulating layers and a plurality of second insulating layers on one another, a substrate supporter coupled to the process chamber to support the substrate, a gas ejector coupled onto the process chamber to face the substrate supporter, and a plasma reactor disposed outside the process chamber and connected to the gas ejector, the substrate processing method comprising:

a pretreatment step for forming a passivation layer by supplying, onto the substrate through the gas ejector, a pretreatment gas comprising a hydrogen-containing gas and an oxygen-containing gas; and an etching step for selectively and at least partially etching the plurality of second insulating layers in a lateral direction relative to the plurality of first insulating layers by supplying, onto the substrate through the gas ejector, an etchant comprising a halogen-containing gas, a hydrogen-containing gas, an oxygen-containing gas, and a halogen- and hydrogen-containing product produced by reaction of the halogen-containing gas and the hydrogen-containing gas, wherein, in the etching step, at least one of the halogen-containing gas and the hydrogen-containing gas is activated in the plasma reactor and supplied to the gas ejector in a form of radicals.

2. The substrate processing method of claim 1, wherein, in the etching step, the halogen-containing gas and an inert gas are supplied to the plasma reactor, and the hydrogen-containing gas and the oxygen-containing gas are supplied to the gas ejector.

3. The substrate processing method of claim 1, wherein, in the etching step, the halogen-containing gas and an inert gas are supplied to the plasma reactor, and the hydrogen-containing gas and the oxygen-containing gas are also supplied to the plasma reactor.

4. The substrate processing method of claim 1, wherein, in the etching step, the hydrogen-containing gas and the oxygen-containing gas are supplied to the plasma reactor, and the halogen-containing gas is supplied to the gas ejector.

5. The substrate processing method of claim 1, further comprising a removal step for removing the passivation layer, after the etching step.

6. The substrate processing method of claim 1, wherein the passivation layer is formed on at least exposed portions of the underlayer, and wherein, in the etching step, the plurality of second insulating layers are selectively etched relative to the plurality of first insulating layers and the underlayer.

7. The substrate processing method of claim 6, wherein the plurality of first insulating layers comprise silicon oxide (SiO$_2$) layers, wherein the plurality of second insulating layers comprise silicon nitride (SiN) layers, and wherein the underlayer comprises a polysilicon layer.

8. The substrate processing method of claim 1, wherein, in the etching step, the halogen-containing gas is activated in the plasma reactor and supplied to the gas ejector in a form of radicals, and the hydrogen-containing gas and the oxygen-containing gas are supplied to the gas ejector in an inactive state.

9. The substrate processing method of claim 8, wherein the hydrogen-containing gas and the oxygen-containing gas are supplied to the gas ejector through a connection pipe connecting the plasma reactor and the gas ejector.

10. The substrate processing method of claim 1, wherein the halogen-containing gas comprises $NF_3$ gas, wherein the hydrogen-containing gas comprises $NH_3$ gas, and wherein the product comprises ammonium fluoride ($NH_3$ $(HF)_x$).

11. The substrate processing method of claim 1, wherein the oxygen-containing gas comprises $O_2$ gas, $O_3$ gas, or $N_2O$ gas.

* * * * *